(12) United States Patent
Bean, Jr.

(10) Patent No.: US 7,861,596 B2
(45) Date of Patent: Jan. 4, 2011

(54) METHOD AND SYSTEM FOR DETECTING AIR PRESSURE NEUTRALITY IN AIR CONTAINMENT ZONES

(75) Inventor: John H. Bean, Jr., Wentzville, MO (US)

(73) Assignee: American Power Conversion Corporation, West Kingston, RI (US)

( * ) Notice: Subject to any disclaimer, the term of this patent is extended or adjusted under 35 U.S.C. 154(b) by 110 days.

(21) Appl. No.: 12/361,055

(22) Filed: Jan. 28, 2009

(65) Prior Publication Data

US 2010/0186517 A1 Jul. 29, 2010

(51) Int. Cl.
*G01L 9/04* (2006.01)
(52) U.S. Cl. .......................................... 73/726
(58) Field of Classification Search ............... None
See application file for complete search history.

(56) References Cited

U.S. PATENT DOCUMENTS

| | | | |
|---|---|---|---|
| 3,791,089 A | 2/1974 | Alderman | |
| 4,083,245 A | 4/1978 | Osborn | |
| 4,317,374 A * | 3/1982 | Casey | 73/861.53 |
| 4,561,309 A | 12/1985 | Rosner | |
| 5,663,508 A | 9/1997 | Sparks | |
| 6,199,337 B1 | 3/2001 | Colson et al. | |
| 6,668,565 B1 | 12/2003 | Johnson et al. | |
| 6,859,366 B2 | 2/2005 | Fink | |
| 6,880,349 B2 | 4/2005 | Johnson et al. | |
| 6,967,283 B2 | 11/2005 | Rasmussen et al. | |
| 6,980,433 B2 | 12/2005 | Fink | |
| 7,046,514 B2 | 5/2006 | Fink et al. | |
| 7,096,147 B1 | 8/2006 | Low | |
| 7,140,193 B2 | 11/2006 | Johnson et al. | |
| 7,145,772 B2 | 12/2006 | Fink | |
| 7,165,412 B1 | 1/2007 | Bean, Jr. | |
| 7,173,820 B2 | 2/2007 | Fink et al. | |

(Continued)

FOREIGN PATENT DOCUMENTS

| | | |
|---|---|---|
| DE | 1 943 021 | 3/1970 |
| EP | 0 033 182 A2 | 8/1981 |
| WO | 02/41777 A1 | 5/2002 |

OTHER PUBLICATIONS

International Search Report for PCT/US2009/068913 mailed Mar. 19, 2010.

(Continued)

*Primary Examiner*—Andre J Allen
(74) *Attorney, Agent, or Firm*—Lando & Anastasi, LLP

(57) ABSTRACT

An airflow detecting system includes a tubular structure having an inner surface defining an interior of the tubular structure, one open end and an opposite open end. The tubular structure is configured to receive and expel air through both the one end and the opposite end. The system further includes a flap connected to the inner surface of the tubular structure by a hinge. The flap is configured to impede airflow within the interior of the tubular structure upon the application of differential pressure across the two ends of the tubular structure. The system further includes a device attached to the flap in a position in which the device spans the hinge. The device is configured to measure a parameter associated with the movement of the flap in response to airflow within the interior of the tubular structure. Other embodiments and methods are further disclosed.

11 Claims, 9 Drawing Sheets

U.S. PATENT DOCUMENTS

| | | |
|---|---|---|
| 7,259,963 B2 | 8/2007 | Germagian et al. |
| 7,293,666 B2 | 11/2007 | Mattlin et al. |
| 7,325,410 B1 | 2/2008 | Bean, Jr. |
| 7,520,181 B2 | 4/2009 | Ye et al. |
| 2003/0050003 A1 | 3/2003 | Charron |
| 2006/0248961 A1 | 11/2006 | Shachar et al. |
| 2007/0167125 A1 | 7/2007 | Rasmussen et al. |

OTHER PUBLICATIONS

American Power Conversion Corporation Brochure, "Hot Aisle Containment System (HACS)," 2008, pp. 1-68.

Invitation to Pay Additional Fees and Partial International Search Report for PCT/US2009/053759 mailed Nov. 16, 2009.

* cited by examiner

METHOD AND SYSTEM FOR DETECTING AIR PRESSURE NEUTRALITY IN AIR CONTAINMENT ZONES

BACKGROUND OF THE DISCLOSURE

1. Field of the Disclosure

The present disclosure relates to racks and enclosures, and more particularly to equipment used to measure airflow within racks and enclosures of the type used to house data processing, networking and telecommunications equipment.

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. In certain embodiments, an equipment storage rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by supplementing a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

In other embodiments, the CRAC units may be modular and scalable so that the units may be placed anywhere within the data center depending on the cooling requirements within the data center. Such cooling units are described in pending U.S. patent application Ser. No. 11/335,874, entitled COOLING SYSTEM AND METHOD, filed on Jan. 19, 2006.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. Airflow requirements can vary considerably as a result of different numbers and types of rack-mounted components and different configurations of racks and enclosures.

SUMMARY OF THE DISCLOSURE

One aspect of the disclosure is directed to an airflow detecting system comprising a tubular structure having an inner surface defining an interior of the tubular structure, one open end and an opposite open end. The tubular structure is configured to receive and expel air through both the one end and the opposite end. The system further comprises a flap connected to the inner surface of the tubular structure by a hinge. The flap is configured to impede airflow within the interior of the tubular structure upon the application of differential pressure across the two ends of the tubular structure. The system further comprises a device attached to the flap in a position in which the device spans the hinge. The device is configured to measure a parameter associated with the movement of the flap in response to airflow within the interior of the tubular structure.

Embodiments of the airflow detecting system include configuring the flap to be integrally formed with a membrane that is secured to the inner surface of the tubular structure. In one embodiment, the device is a strain gauge that measures the strain effected on the hinge when the flap moves. The system may further comprise at least one stop disposed on the inner surface of the tubular structure to engage the flap.

Another aspect of the disclosure is directed to an air containment system comprising a panel defining a boundary of an air containment zone, and an airflow detecting system coupled to the panel. The airflow detecting system comprises a tubular structure having an inner surface defining an interior of the tubular structure, one open end and an opposite open end. The tubular structure is configured to receive and expel air through both the one end and the opposite end. The airflow detecting system further comprises a flap connected to the inner surface of the tubular structure by a hinge. The flap is configured to impede airflow within the interior of the tubular structure upon the application of differential pressure across the two ends of the tubular structure. The airflow detecting system further comprises a device attached to the flap in a position in which the device spans the hinge. The device is configured to measure a parameter associated with the movement of the flap in response to airflow within the interior of the tubular structure.

Embodiments of the air containment system include configuring the flap to be integrally formed with a membrane that is secured to the inner surface of the tubular structure. In one embodiment, the device is a strain gauge that measures the strain effected on the hinge when the flap moves. The airflow detecting system may further comprise at least one stop disposed on the inner surface of the tubular structure to engage the flap. In other embodiments, the air containment system may comprise means for controlling airflow into and out of the air containment zone. The means for controlling airflow comprises at least one cooling unit configured to cool air within the air containment zone in which the at least one cooling unit including a fan, and a controller coupled to the airflow detecting system and the at least one cooling unit. The controller is configured to manipulate the fan of the at least one cooling unit in response to the measured parameter.

A further aspect of the disclosure is directed to an airflow detecting system comprising a structure having an inner surface defining an interior of the structure, one open end and an opposite open end. The structure is configured to receive and expel air through the one end and the opposite end. The airflow detecting system further comprises a flap connected to the inner surface of the tubular structure by a hinge. The flap is configured to impede airflow within the interior of the tubular structure upon the application of differential pressure across the two ends of the tubular structure. The airflow detecting system further comprises a device attached to the flap in a position in which the device spans the hinge. The device is configured to measure a parameter associated with the movement of the flap in response to airflow within the interior of the structure.

Embodiments of the airflow detecting system include configuring the flap to be integrally formed with a membrane that is secured to the inner surface of the tubular structure. In one embodiment, the device is a strain gauge that measures the strain effected on the hinge when the flap moves. In another embodiment, the structure is a tubular structure. The airflow detecting system may further comprise at least one stop disposed on the inner surface of the tubular structure to engage the flap.

Yet another embodiment of the disclosure is directed to an airflow detecting system comprising a structure having an inner surface defining an interior of the structure, one open end and an opposite open end. The structure is configured to receive and expel air through the one end and the opposite end. The airflow detecting system further comprises a membrane connected to the inner surface of the structure to block the interior of the structure, and means associated with the membrane to enable airflow within the interior of the structure upon the application of differential pressure across the two ends of the tubular structure and to measure a parameter associated with the movement of the flap in response to airflow within the interior of the structure.

Embodiments of the airflow detecting system include a flap formed in the membrane in which the flap may be integrally formed with the membrane. The flap is connected to the membrane by a hinge, the flap being configured to block the interior of the structure and to enable airflow within the interior of the structure upon the introduction of airflow within one of the one open end and the opposite open end. The means associated with the membrane further comprises a device attached to the flap in a position in which the device spans the hinge. The device is configured to measure a parameter associated with the movement of the flap in response to airflow within the interior of the structure. In one embodiment, the device is a strain gauge that measures the strain effected on the hinge when the flap moves. In another embodiment, the structure is a tubular structure. The airflow detecting system may further comprise at least one stop disposed on the inner surface of the tubular structure to engage the flap.

Another aspect of the disclosure is directed to a method for detecting airflow within an air containment zone. The method comprises: providing an airflow detecting system at a boundary of the air containment zone; and measuring a parameter of airflow within the air containment zone with the airflow detecting system.

Embodiments of the method may further include measuring strain applied to a flap of the airflow detecting system. Additionally, the parameter may be a direction of airflow. The airflow detecting system may comprise a structure having an inner surface defining an interior of the tubular structure, one open end and an opposite open end, the tubular structure being configured to receive and expel air through both the one end and the opposite end, a membrane connected to the inner surface of the tubular structure to block the interior of the tubular structure, a flap formed in the membrane, the flap being connected to the membrane by a hinge, the flap being configured to impede airflow within the interior of the tubular structure upon the application of differential pressure across the two ends of the tubular structure, and a device attached to the flap in a position in which the device spans the hinge, the device being configured to measure a parameter associated with the movement of the flap in response to airflow within the interior of the tubular structure. Providing an airflow detecting system may comprise inserting the airflow detecting system in a panel of the air containment zone. The method may further comprise controlling a flow of air out of the air containment zone based on the measured parameter.

A further aspect of the disclosure is directed to an airflow detecting system comprising a tubular structure having an inner surface defining an interior of the tubular structure, one open end and an opposite open end, the tubular structure being configured to receive and expel air through both the one end and the opposite end. The airflow detecting system further comprises a membrane connected to the inner surface of the tubular structure to block the interior of the tubular structure. The airflow detecting system further comprises a flap formed in the membrane, with the flap being connected to the membrane by a hinge. The flap is configured to impede airflow within the interior of the tubular structure upon the application of differential pressure across the two ends of the tubular structure. The airflow detecting system further comprises a device attached to the flap in a position in which the device spans the hinge. The device is configured to measure a parameter associated with the movement of the flap in response to airflow within the interior of the tubular structure.

Another embodiment of the disclosure is directed to an air containment system comprising a panel defining a boundary of an air containment zone, an airflow detecting system coupled to the panel, the airflow detecting system being configured to measure direction and magnitude of airflow entering into and out of the boundary of the air containment zone, and means for controlling airflow into and out of the air containment zone based on a measurement of direction and magnitude of airflow detected by the airflow detecting system.

Embodiments of the air containment system include configuring the airflow detecting system so that it comprises a tubular structure having an inner surface defining an interior of the tubular structure, one open end and an opposite open end, the tubular structure being configured to receive and expel air through both the one end and the opposite end, a flap connected to the inner surface of the tubular structure by a hinge, the flap being configured to impede airflow within the interior of the tubular structure upon the application of differential pressure across the two ends of the tubular structure, and a device attached to the flap in a position in which the device spans the hinge, the device being configured to measure a parameter associated with the movement of the flap in response to airflow within the interior of the tubular structure. In one embodiment, the flap is integrally formed with a membrane that is secured to the inner surface of the tubular structure. In another embodiment, the device is a strain gauge that measures the strain effected on the hinge when the flap moves. The airflow detecting system may further comprise at least one stop disposed on the inner surface of the tubular structure to engage the flap. The air containment system may further comprise at least one cooling unit configured to cool air within the air containment zone, the at least one cooling unit including a fan, and a controller coupled to the airflow detecting system and the at least one cooling unit. The controller is configured to manipulate the fan of the at least one cooling unit in response to the measurement of direction and magnitude of airflow detected by the airflow detecting system.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE PREFERRED EMBODIMENTS

Figure 1:
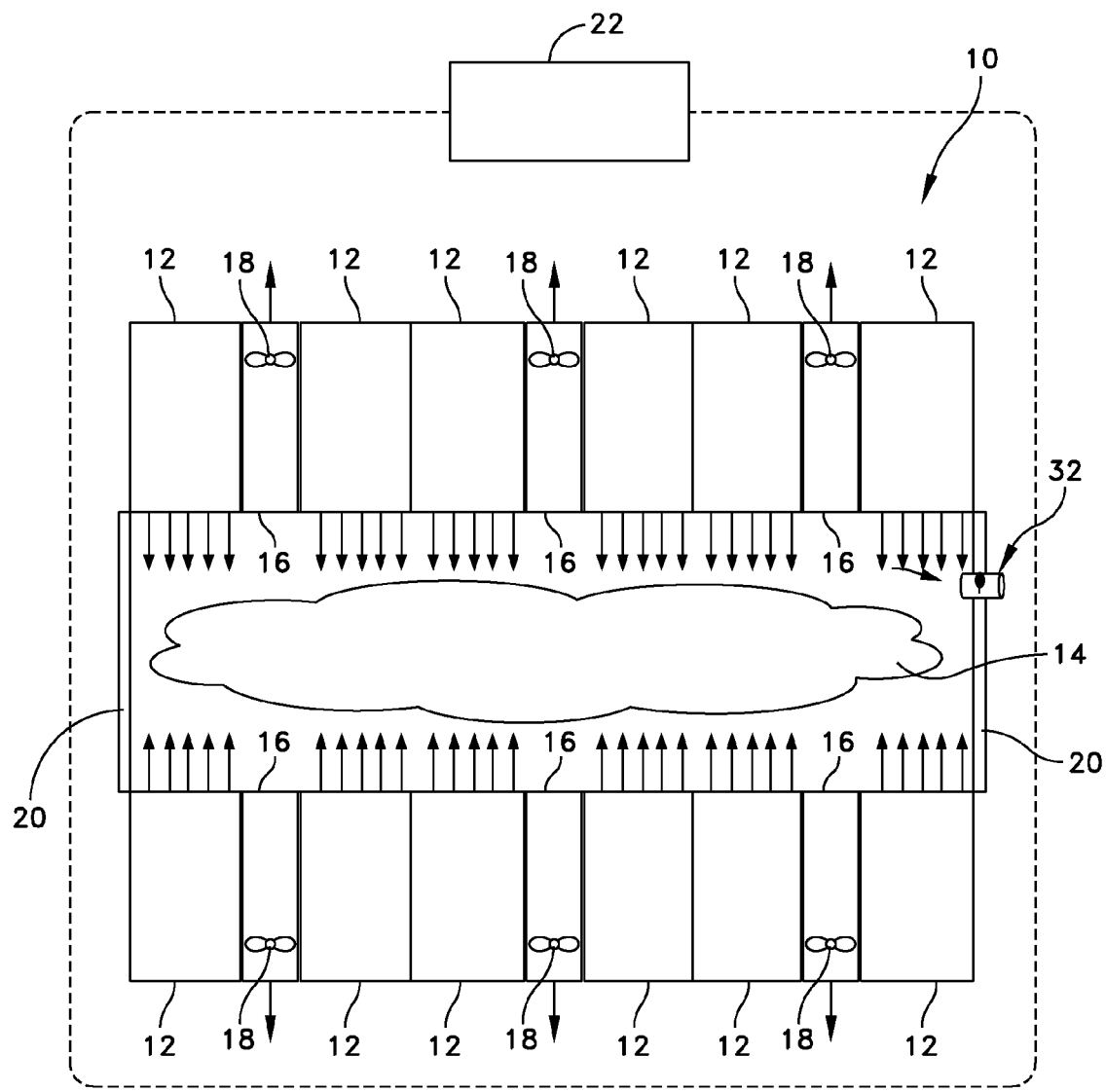
FIG. 1 is a schematic top plan view of a portion of a data center employing an airflow detecting system of an embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference. Other examples of equipment racks are sold by American Power Conversion Corporation under the brand name NetShelter™. Further, cabling between the equipment racks may be implemented using cable distribution troughs contained on the roofs of the racks as disclosed in U.S. Pat. No. 6,967,283, which is also incorporated herein by reference and assigned to the assignee of the present disclosure. The principles of the present disclosure may be adapted to smaller data centers, equipment rooms, computer rooms, and even wiring closets. The data center described herein is provided by way of example only.

Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. A lock may be provided to prevent access into the interior of the equipment rack and the equipment housed by the rack. The sides of the equipment rack may include at least one panel to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Casters may be secured to the bottom of each equipment rack to enable the rack to roll along the floor of the data center. Once positioned, leveling feet may be deployed to securely ground the equipment rack in place within the row.

Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks wherein the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the traditional CRAC units described above. With yet another configuration, a modular cooling system may be provided.

Such a modular system is described in pending U.S. patent application Ser. No. 11/335,874, entitled COOLING SYSTEM AND METHOD, filed on Jan. 19, 2006, which is owned by the assignee of the present disclosure and is incorporated herein by reference. The cooling system may include a plurality of cooling racks disposed within the data center. In one embodiment, the arrangement may be such that there is a cooling rack for every two equipment racks provided in the data center. However, it should be understood that a person skilled in the art, and given the benefit of this disclosure, may provide more or less cooling racks within the data center depending on environmental conditions of the data center. Further in some embodiments, the concentration and locations of cooling racks may be adjusted based on the locations of the hottest racks in the data center, or based on information obtained and analyzed by a data center information management system and the type of equipment housed within the data center.

Details of the modular cooling system and its various components and configurations may be found in pending U.S. patent application Ser. No. 11/335,874. Also, the cooling system may embody other cooling configurations, such as those offered by American Power Conversion Corporation of West Kingstown, R.I., the assignee of the present disclosure.

In one embodiment, a management system may be provided to monitor and display conditions of a cooling rack or of multiple cooling racks. The management system may operate independently to control the operation of the cooling rack, and may be configured to communicate with a higher level network manager or with a management system associated with the equipment storage racks. For example, in a particular embodiment, a controller may be provided to control the operation of the cooling racks. The controller may be a dedicated unit to the cooling system of the data center. In another embodiment, the controller may be provided as part of an integrated data center control and monitoring system. In yet another embodiment, each cooling rack may be independently operable by a controller provided in the cooling rack that is in communication with controllers of the other cooling racks. Notwithstanding the particular configuration, the controller is designed to control the independent operation of the cooling racks within the data center.

For example, the controller may be configured to identify the failure or inability of a particular cooling rack located within the data center to cool the air, and to increase the cooling capacity of a cooling rack or cooling racks located near the failed cooling rack. In another embodiment, one cooling rack may operate as the main or master unit and the other cooling racks operate as subservient units that operate under the control of the main unit. In this embodiment, the main cooling rack may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling racks within the cooling system based on the energy drawn by the equipment racks.

As with the equipment racks, the cooling racks may be modular in construction and configured to be rolled into and out of position, e.g., within a row of the data center between two equipment racks. Casters may be secured to the bottom of the housing of the cooling rack to enable the cooling rack to roll along the floor of the data center. Once positioned, leveling feet may be deployed to securely ground the cooling rack in place within the row. In another embodiment, the housing of the cooling rack may be formed with an eye-bolt to enable a crane or some other lifting apparatus to raise and place the cooling rack within the data center.

In one embodiment, the arrangement is such that the fronts of the equipment and cooling racks are adjacent the cold aisle and the backs of the racks are adjacent the hot aisle. The modular and movable nature of the cooling rack makes it particularly effective in cooling locations within the data center requiring climate control, e.g., adjacent a hot aisle. This configuration enables the cooling rack to be used as a building block for data center cooling and climate control, as the data center operator adds and removes cooling racks on an as needed basis. Thus, the cooling rack allows a far superior level of scalability than prior CRAC units. In addition, an operable cooling rack may be quickly and easily provided to replace a failed cooling rack.

The controller may be adapted to control the operation of the cooling system based on environmental parameters obtained by the controller. In one embodiment, the controller may embody only controller units provided in the cooling racks that communicate with one another over a controller area network (CAN) Bus. In other embodiments, a master controller may be provided to control the operation of the controller units. Each cooling rack may be provided with a display assembly that is operably coupled to the controller. The display assembly is adapted to display the environmental conditions of the data room, such as, and not limited to, the temperature and the humidity of the data center at the cooling rack, the temperature of the air entering into and exiting out of the cooling rack, the temperature of coolant entering into and exiting out of the cooling rack, the flow rate of coolant entering the cooling rack, and the cooling capacity of the cooling rack. As discussed in greater detail below, the display assembly may be configured to display airflow direction and magnitude within a particular hot aisle within the data center. Suitable monitors and/or gauges may be provided to acquire such information. Alternatively, or in addition to the foregoing embodiment, the environmental conditions may be displayed on a unit provided with an integrated data center control and monitoring system.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks.

One embodiment of an air containment system of the disclosure may include a plurality of panel assemblies configured to be arranged in side-to-side relation to form a ceiling. In one embodiment, each panel assembly may be configured to include a flexible, lightweight panel having a first end, a second opposite end, a first side and a second opposite side. The panel assembly further may be further configured with a first end connector configured to secure the first end of the flexible panel to one of a rack and a wall, a second end connector configured to secure the second end of the flexible panel to one of a rack and a wall, a first side connector configured to secure the first side of the flexible panel to a second side of a flexible panel of an adjacent panel assembly, and a second side connector configured to secure the second side of the flexible panel to a first side of a flexible panel of an adjacent panel assembly. This construction enables multiple panel assemblies to be quickly and easily installed between rows of equipment racks that are either newly constructed or existing, regardless of the lengths of the rows or the width of the aisle. Other air containment systems may also be provided. For example, hot aisle air containment systems may be found in U.S. Pat. Nos. 6,859,366 and 7,046,514. Other examples of hot aisle containment systems are provided by American Power Conversion Corporation of West Kingston, R.I., the assignee of the present disclosure, under model nos. ACDC1014, ACDC1015, ACDC1018 and ACDC1019.

Referring now to the drawings, and more particularly to FIG. 1, there is generally indicated at 10 a portion of an exemplary data center. As shown, the data center includes a plurality of equipment racks, each indicated at 12. The equipment racks 12 contain IT equipment, which may include data processing, networking and telecommunications equipment. The equipment racks 12 are configured in rows to define a hot aisle 14, which may be considered an air containment zone that is segregated from the rest of the data center. The arrangement is such that cool air enters the fronts of the equipment racks 12 and warm air is exhausted from the backs of the equipment racks.

The front of each equipment rack 12 may include one or more doors to enable access into the interior of the equipment rack. Although not shown, the front of the equipment rack 12 may include two doors. The sides of each equipment rack 12 may include one or more panels (not designated) to enclose the interior region of the equipment rack. The back of each equipment rack 12 may also include at least one panel (not shown) and/or a back door (not shown) to provide access to the interior of the equipment rack from the hot aisle 14. The side and back panels, as well as the front door and the back door, may be fabricated from perforated sheet metal, for example, to allow air to flow into and out of the interior region of the equipment rack.

One or more cooling units, each indicate at 16, may be disposed in between the equipment racks 14 to address heat build up contained within the hot aisle 14. The cooling units 16 may be configured to draw warm air from the hot aisle 14 through the backs of the cooling units, cool the warm air, and exhaust cool air from the fronts of the cooling units to the data center. To achieve the air flow from the hot aisle to the remainder of the data center, each cooling unit 16 may include one or more fans 18, which drive the movement of air through the respective cooling unit.

The equipment racks 12 and the cooling units 16 may be modular in construction and configured to be rolled into and out of position, e.g., within a row of the data center. Casters (not shown) may be secured to the bottom of each equipment rack 12 and cooling unit 16 to enable them to roll along the floor of the data center. Once positioned, leveling feet (not shown) may be deployed to securely ground the equipment racks 12 and the cooling units 16 in place within the row.

The hot aisle 14 may be defined by a ceiling or roof (not shown) and one or more walls or panels, each indicated at 20 in FIG. 1. A controller 22 is provided to control the operation of the equipment rack 12 or the cooling unit 16, or both. As discussed above, the controller 22 may be a dedicated unit to the cooling system of the data center 10 or part of an integrated data center control and monitoring system. In another embodiment, each cooling unit 16 may be independently operable by a dedicated controller provided in the cooling unit that is in communication with controllers of the other cooling units or with a network in communication with a master controller. Notwithstanding the particular configuration, the controller 22 is designed to control the independent operation of the cooling units 16 within the data center 10. Accordingly, the controller is illustrated schematically in FIG. 1 as being able to control all of the components used to measure and manipulate airflow within the air containment zone.

The controller 22 is configured to identify the failure or inability of a particular cooling unit 16 located within the data center 10 to cool the air, and to increase the cooling capacity of a cooling unit. Thus, the controller may control the air flow within the hot aisle 14 by manipulating the fans 18 of the cooling units. The controller 22 may be adapted to communicate with one another over a controller area network (CAN) Bus. Each cooling unit 16 may be provided with a display assembly (not shown) to display the environmental conditions of the data room, such as, and not limited to, the temperature and the humidity of the data center at the cooling unit, the temperature of the air entering into and exiting out of the cooling unit, the temperature of coolant entering into and exiting out of the cooling unit, the flow rate of coolant entering and/or exiting the cooling unit, and the cooling capacity of the cooling unit. The operation of the controller 22 is further discussed below with reference to FIGS. 7-9.

Figure 2:
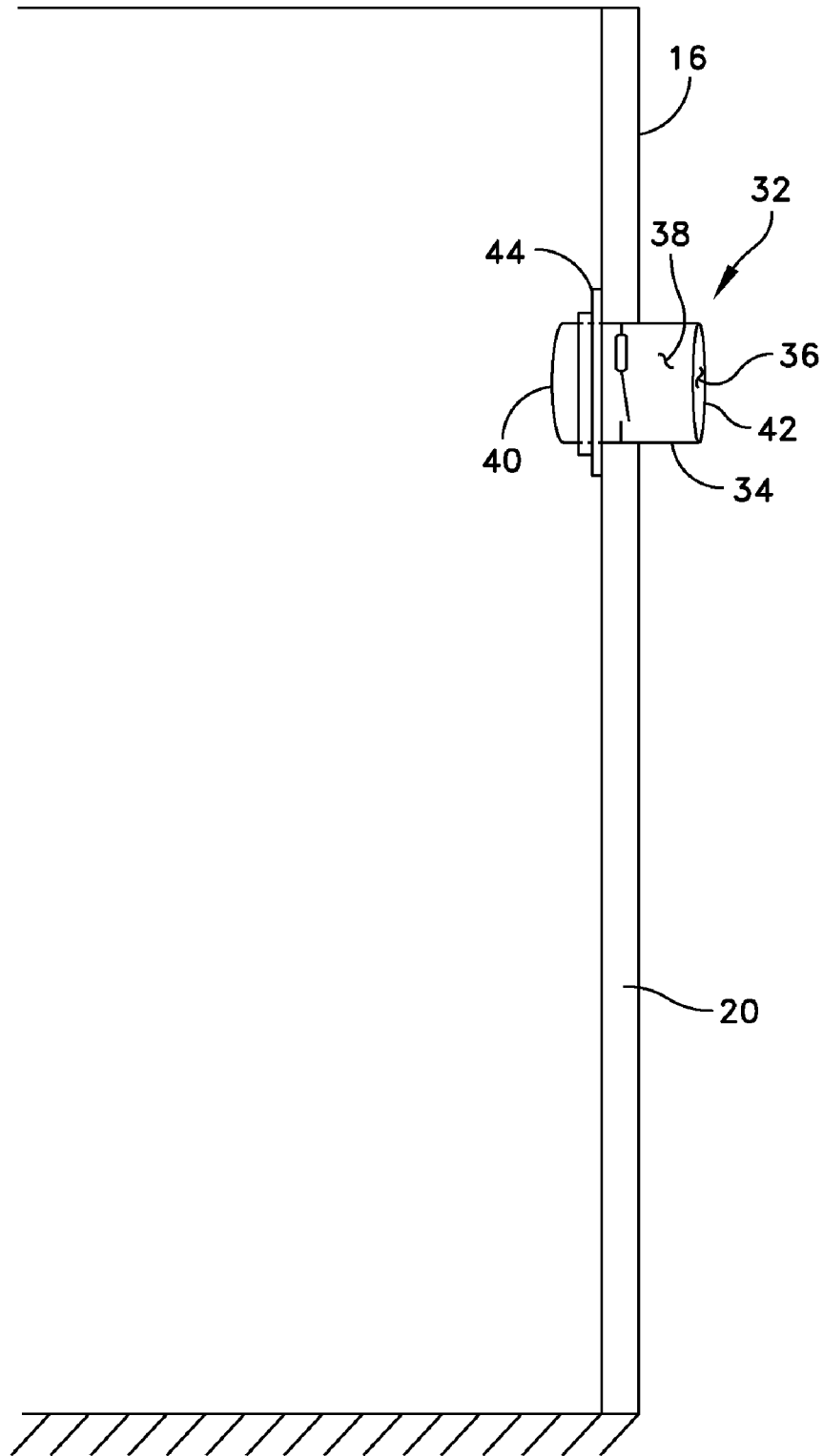
FIG. 2 is a schematic elevational view of an airflow detecting system of an embodiment of the disclosure.

With additional reference to FIG. 2, an embodiment of an airflow detecting system is generally indicated at 32. As shown, the airflow detecting system 32 is disposed within wall 20 of the hot aisle 14, which defines a boundary between the hot aisle and the room at large. In another embodiment, the airflow detecting system 32 may be disposed within the backs of one or more equipment rack 12 and/or one or more cooling units 16, or in any suitable location within the data center 10 where there is a boundary between a hot aisle 14 and the remainder of the data center.

The airflow detecting system 32 includes a tubular body 34 having an inner surface 36 defining an interior of the tubular body and an outer surface 38. The tubular body 34 further includes opposite open ends 40, 42 configured to receive and expel air there through depending on the direction of airflow within the equipment rack 10. A flange 44 may be provided to secure the tubular body 34 to the wall 20. As shown, the flange 44 is configured to engage the outer surface 38 of the tubular body 34 and to be secured to the wall 20 by suitable fasteners (not shown), e.g., machine screw fasteners. The flange 44 may be suitably secured to the outer surface 38 of the tubular body 34. In one embodiment, the flange 44 may press fit on the outer surface 38 of the tubular body 34. In another embodiment, the flange 44 may be secured to the tubular body 34 by an appropriate adhesive.

Figure 3A:
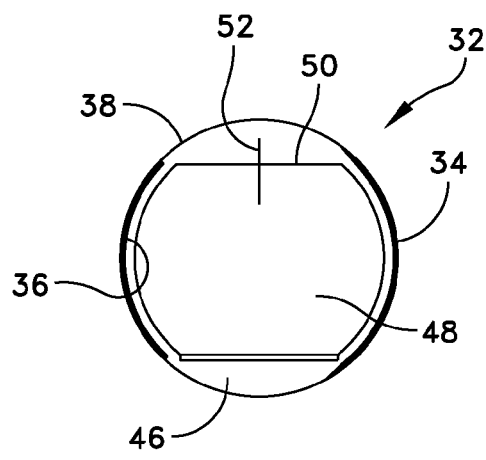
FIG. 3A is a schematic end view of the airflow detecting system shown in FIG. 2 with a flap of the system being shown in a closed position.
Figure 3B:
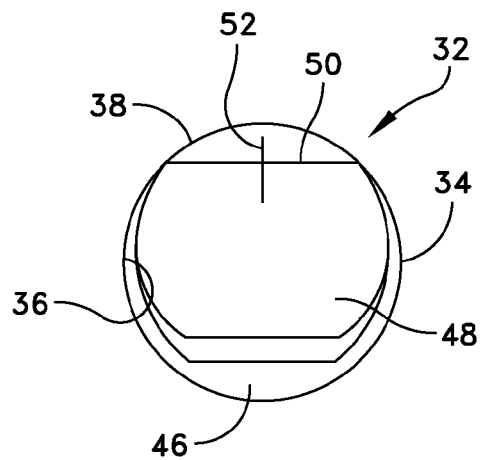
FIG. 3B is a schematic end view of the airflow detecting system shown in FIG. 2 with the flap of the system being shown in an open position.

FIGS. 3A and 3B show a schematic of an embodiment of the working components of the airflow detecting system 32.

As shown, a membrane 46 is disposed within the tubular body 34. Specifically, the membrane 46 is connected to the inner surface 36 of the tubular body 34 to block or otherwise impede airflow within the interior region defined by the tubular body. In one embodiment, the membrane 46 may be integrally formed with the tubular body 34. In another embodiment, the membrane 46 may be a separate component that is secured to the inner surface 36 of the tubular body 34 by any suitable method. The airflow detecting system further includes a flap 48 that is formed in the membrane 46. As shown, the flap 48 is connected to the membrane 46 by a hinge 50 that enables movement of the flap relative to the membrane.

In one embodiment, the flap 48 and the membrane 46 are integral with one another so that the hinge 50 is a "living hinge" in which the membrane and flap (and tubular body) may be fabricated from a suitable plastic material, such as polyethylene or polypropylene. The arrangement is such that the flap 48 is capable of blocking the interior region of the tubular body 34 as shown in FIG. 3A. When air moves either into or out of the equipment rack, the flap 48 is configured to enable airflow within the interior of the tubular body 34 through one open end (e.g., open end 40) and out of the other open end (e.g., open end 42). Thus, the airflow detecting system 32 enables airflow from the interior of the equipment rack to the exterior of the equipment rack and exterior of the equipment rack to the interior of the equipment rack.

To measure the direction of airflow, and the strength of the airflow, a device 52 may be attached to the flap 48 in a position in which the device spans the hinge 50. In this position, the device 52 is configured to measure the direction of movement of the flap 48 and the amount of movement of the flap. In a particular embodiment, the device 52 may be a strain gauge that measures strain effected on the hinge 50 when the flap 48 moves. The strain gauge may be of the type manufactured by Tokyo Sokki Kenjuyo Co. Ltd. of Tokyo, Japan under manufacturer part no. GFLA-3-350-50-1L. Thus, the device 52 may be configured to detect no airflow in a neutral position, outward airflow in a tension position, and inward airflow in a compression position. It should be understood that the device 52 may be configured to detect outward airflow in the compression position and inward airflow in a tension position.

The nature of the strain and magnitude may be read to determine both the airflow direction and rate of airflow. The strain gauge produces a change in resistance proportional to the strain exerted upon it. The varied resistance applied across one side of a bridge circuit produces a voltage variation proportional to the resistance change of the strain gauge. This voltage signal may be used as the input to an analog op-amp that provides a certain gain to provide signal amplitude suited for measurement by an analog-to-digital converter ("A/D converter"). The A/D converter is in communication with the controller that applies the necessary operation to provide a numeric value in suitable units (such as cubic feet per minute). This value is then used in combination with other values known to the controller 22 to regulate the fans 18 of the cooling units 16 as needed to maintain the proper proportion of cooler airflow to IT airflow.

Figure 4:
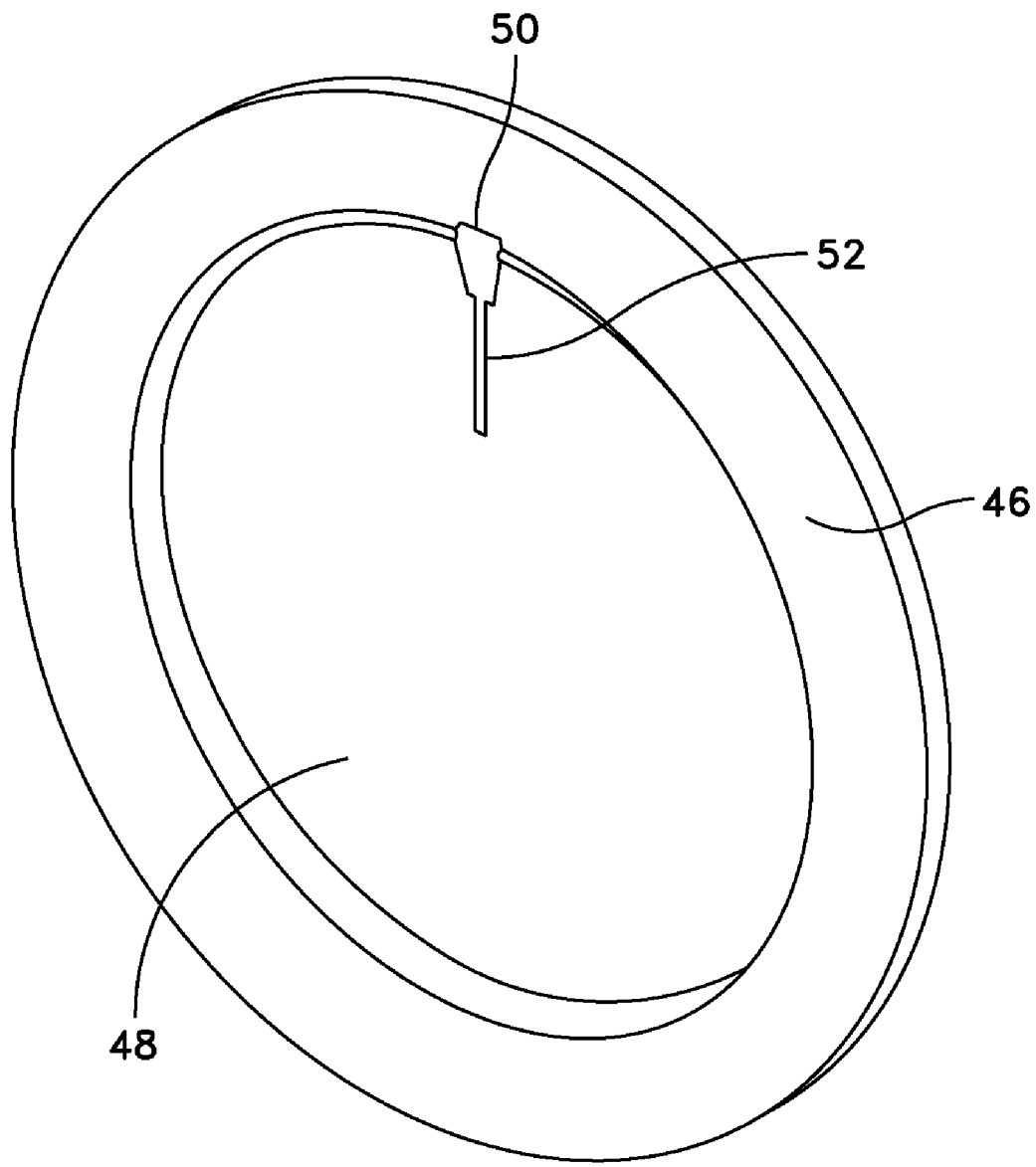
FIG. 4 is a perspective view of a portion of an airflow detecting system of another embodiment of the disclosure
Figure 5:
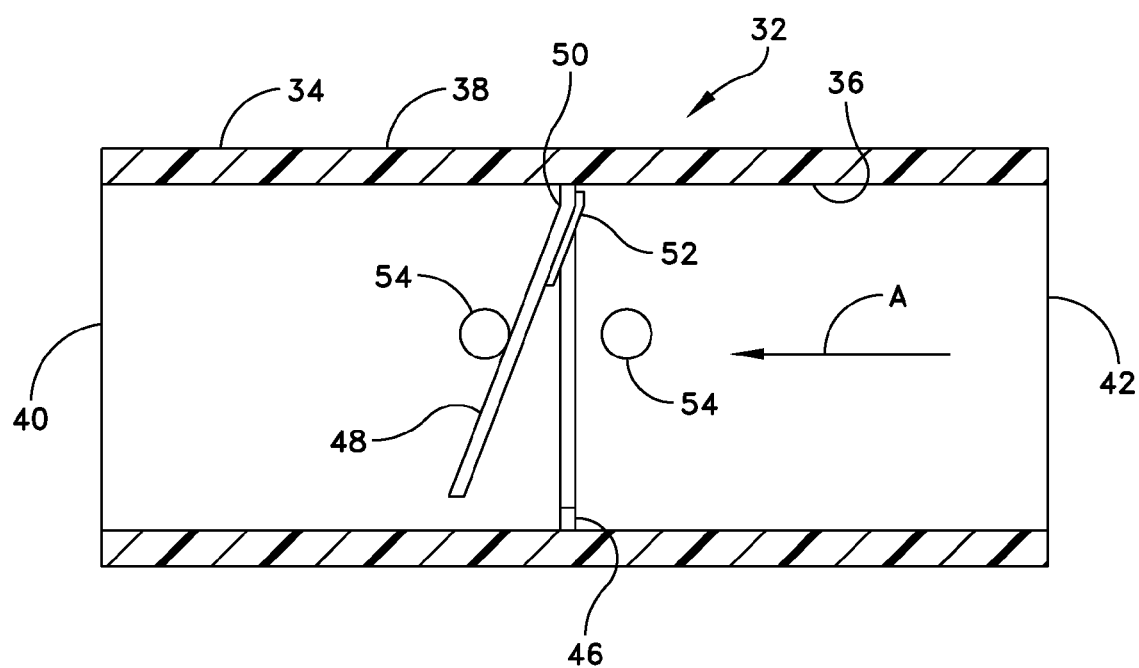
FIG. 5 is a cross-sectional view of an airflow detecting system of another embodiment of the disclosure.
Figure 6:
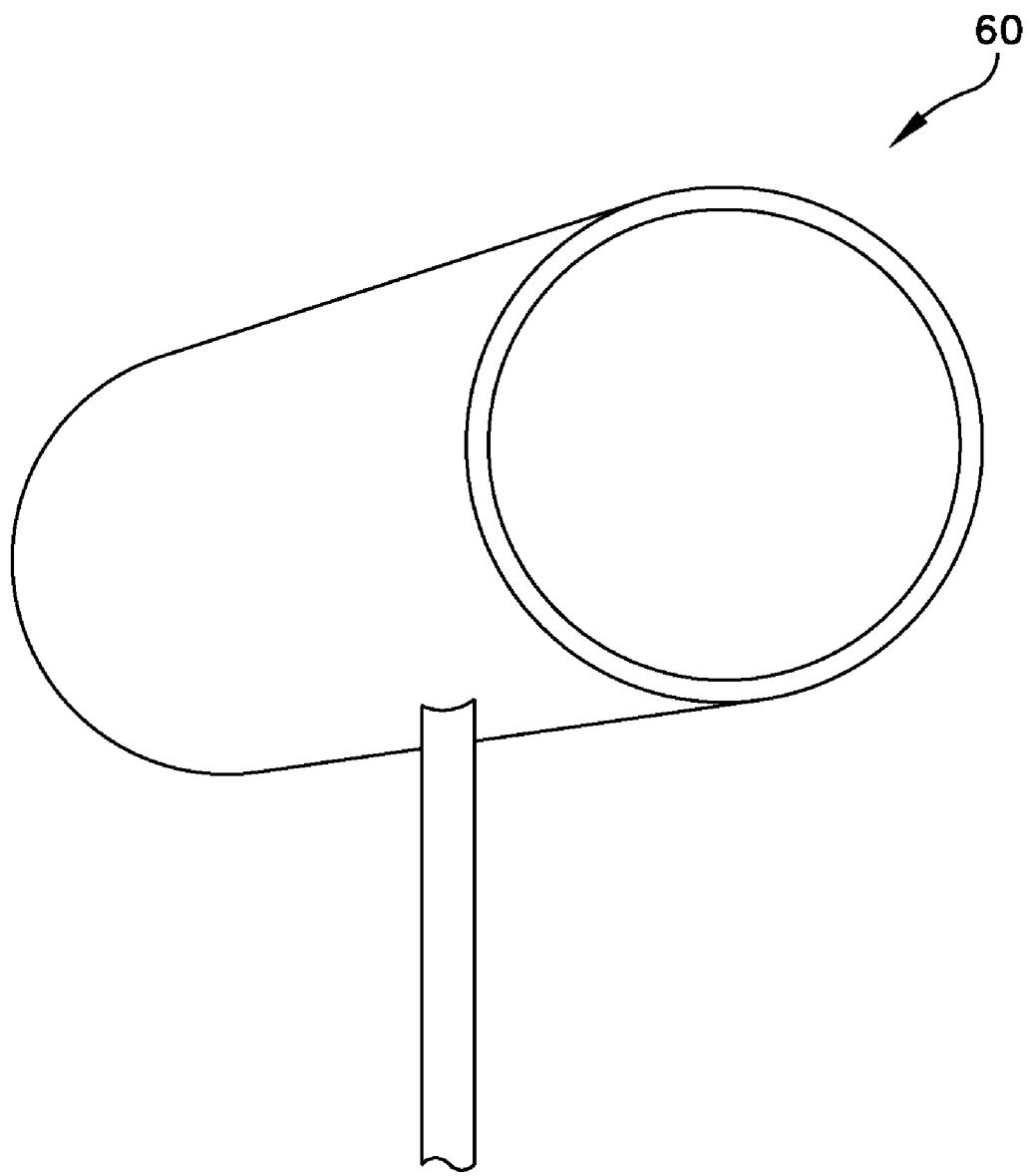
FIG. 6 is a perspective view of an airflow detecting system of another embodiment of the disclosure mounted on a post, which may be secured to an equipment rack.

Referring to FIG. 4, another embodiment of an airflow detecting system is shown having an annular membrane 46 and a flap 48 connected to the membrane by a small hinge 50. As shown, a strain gauge 52 is provided on the hinge 50 to measure tension and compressive forces applied on the hinge by the movement of the flap 48. FIG. 5 illustrates another embodiment of the airflow detecting system 32 with the flap 48 being connected to the inner surface 36 of the tubular structure 34 by the hinge 50. As shown, a small or negligible membrane 46 may be provided. It should be understood that no membrane need be provided. A pair of stops, each indicated at 54, may be provided on the inner surface 36 of the tubular body 34 to engage the flap 48 for preventing excessive movement of the flap when air is flowing through the tubular body at an excessive rate. As shown, air is traveling in a direction shown by arrow A. FIG. 6 illustrates an airflow detecting system 60 of another embodiment mounted on a post 62, which may suitably secured to the equipment rack.

Embodiments of the disclosure may further include a method for detecting airflow within an air containment zone. In one particular embodiment, the method may include providing an airflow detecting system at a boundary of the air containment zone, and measuring a parameter of airflow within the air containment zone with the airflow detecting system. The airflow detecting system may be employed in a panel of the air containment zone or in any other suitable location, e.g., in an equipment rack or a cooling unit, provided the airflow detecting system is located along a boundary of the air containment zone. The measured parameter may be strain applied to a flap of the airflow detecting system. In addition, or in the alternative, the measured parameter may be a direction of airflow. In a certain embodiment, the airflow detecting system may be any of the systems described above. The method may further include controlling a flow of air out of the air containment zone based on the measured parameter. This may be achieved by operating a fan of a cooling unit that is in fluid communication with the air containment zone in response to information obtained by the airflow detecting system.

Referring back to FIG. 1, a plurality of both equipment racks and cooling units may be placed in such a manner as to substantially form an air containment zone between two parallel rows of equipment. This air containment zone may be further enhanced with the inclusion of ceiling panels spanning across the hot aisle. The ceiling panels may be supported by the rows of equipment racks and cooling units at the sides of the aisle and by either a pair of equipment racks or a pair of cooling units, or some combination of equipment racks and cooling units, at the ends of the aisle. Additionally, the integrity of the air containment zone may by further enhanced by the inclusion of one or more door/panel systems placed at each end. Such as system serves to provide a substantial physical barrier between the air containment zone, i.e., the hot aisle, and the larger exterior ambient space.

As shown by arrows in FIG. 1, each equipment rack draws relatively cool air from the larger ambient space and discharges warm air into the air containment zone. The airflow rate of any given equipment rack is highly dependent upon IT work load and ambient temperature, and typically varies substantially over time. The combined net airflow of all IT equipment into the hot air containment zone becomes highly variable and difficult to predict. It is desired to have the cooling unit(s) extract the combined net IT airflow into the air containment zone plus some of a slight additional quantity to assure that any air leakage is cool air into the hot containment zone instead of outward flow of un-cooled hot air. Typically airflow provided by the cooling units would be on the order of magnitude of 110% of the net heated IT airflow. Thus, the air containment zone is at slight negative pressure as compared to the surrounding ambient space. Airflow rates by the cooling units substantially greater than this value serve no benefit to the cooling functionality and result in excessive fan power consumption. Thus, it is most economical to operate the cooling units to remove and cool air from the air containment zone at a rate slightly greater than the rate of hot air entering the air containment zone from the equipment racks.

A calibrated leak may be created in such a manner as to penetrate through one of the physical boundaries. For example, a device, such as one of the airflow detecting systems described above, may be provided in a panel forming the physical barrier. The device may consist of a flow tube and flapper assembly with a "living hinge." The hinge may include a strain gauge oriented in such a manner as to detect strain imposed by various flapper positions across the hinge. Specifically, the strain may show a tension and compression reading. Depending upon which side is in compression and which side in tension, it can be assessed as to which direction the air is flowing (into or out of the containment zone). The magnitude of airflow may also be evaluated by measuring the magnitude of strain across the hinge combined with the characterization of the calibrated leak. This data may be sent to the controller associated with either the equipment rack or the cooling unit or both. The controller may be configured to control the operation of the fan of one of the cooling units or fans of multiple cooling units. The controller may adjust a fan speed based upon a control algorithm to maintain the desired direction and magnitude of leakage between the contained zone and exterior ambient space.

Thus, it should be observed that the airflow detecting systems disclosed herein may be configured in any suitable manner to detect the direction and magnitude of airflow through the equipment rack. It is desirable to closely match the airflow of cooling equipment to that of IT equipment housed within equipment racks. Matching the airflow of cooling equipment to the IT equipment requirement is difficult since the IT equipment may not operate at a constant or known temperature and the measurement of static pressure within containment zones may be extremely difficult to obtain. The provision of the airflow detecting systems disclosed herein offers an elegant solution to obtaining the direction and magnitude of airflow into and out of the containment zones defined by the equipment rack.

As discussed above, the provision of a membrane is not required as evidenced by the embodiment shown in FIG. 5. In addition, although front to back airflow is primarily described herein, the airflow detecting systems of embodiments of the disclosure may be used to detect and measure side-to-side airflow within the equipment rack. In such an embodiment, the airflow detecting device would be mounted on one of the sides of the equipment rack. Also, more than one air detection system may be provided in the air containment zone.

The above defined systems and methods, according to embodiments of the disclosure, may be implemented on one or more general-purpose computer systems. For example, various aspects of the disclosure may be implemented as specialized software executing in a general-purpose computer system 400 such as that shown in FIG. 7. Computer system 400 may include one or more output devices 401, one or more input devices 402, a processor 403 connected to one or more memory devices 404 through an interconnection mechanism 405 and one or more storage devices 406 connected to interconnection mechanism 405. Output devices 401 typically render information for external presentation and examples include a monitor and a printer. Input devices 402 typically accept information from external sources and examples include a keyboard and a mouse. Processor 403 typically performs a series of instructions resulting in data manipulation. Processor 403 is typically a commercially available processor such as an Intel Pentium, Motorola PowerPC, SGI MIPS, Sun UltraSPARC, or Hewlett-Packard PA-RISC processor, but may be any type of processor. Memory devices 404, such as a disk drive, memory, or other device for storing data is typically used for storing programs and data during operation of the computer system 400. Devices in computer system 400 may be coupled by at least one interconnection mechanism 405, which may include, for example, one or more communication elements (e.g., buses) that communicate data within system 400.

Figure 8:
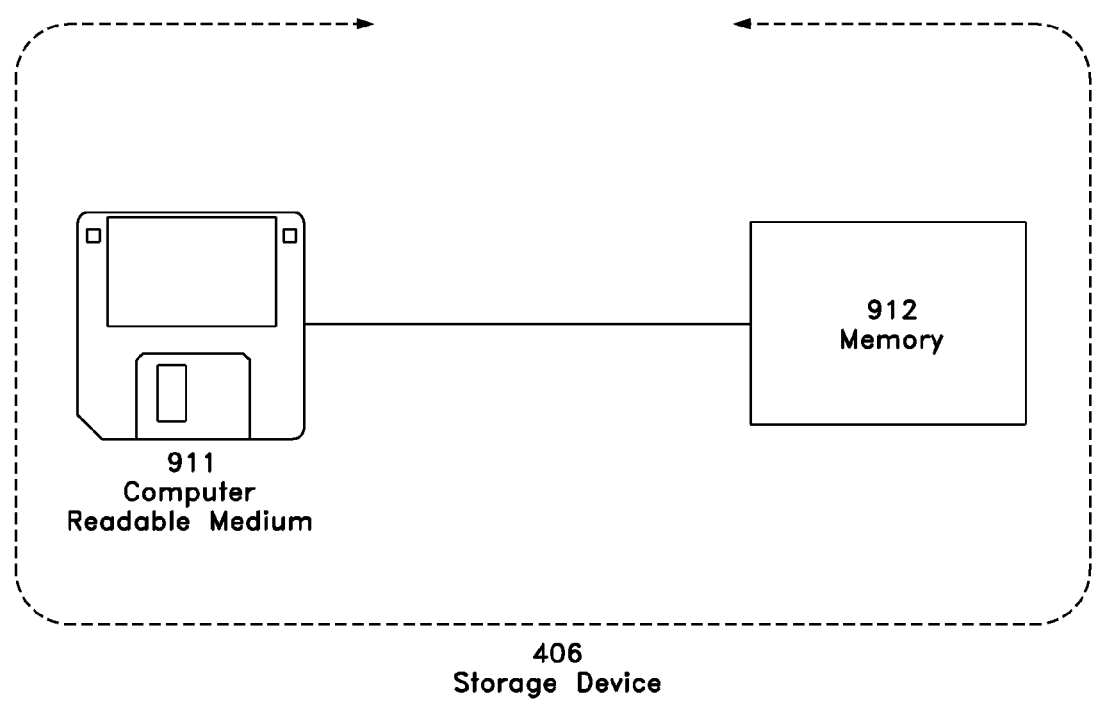
FIG. 8 illustrates a storage device of a general-purpose computer system.

The storage device 406, shown in greater detail in FIG. 8, typically includes a computer readable and writeable nonvolatile recording medium 911 in which signals are stored that define a program to be executed by the processor or information stored on or in the medium 911 to be processed by the program. The medium may, for example, be a disk or flash memory. Typically, in operation, the processor causes data to be read from the nonvolatile recording medium 911 into another memory 912 that allows for faster access to the information by the processor than does the medium 911. This memory 912 is typically a volatile, random access memory such as a dynamic random access memory (DRAM) or static memory (SRAM). Memory 912 may be located in storage device 406, as shown, or in memory device 404. The processor 403 generally manipulates the data within the memory 404, 912 and then copies the data to the medium 911 after processing is completed. A variety of mechanisms are known for managing data movement between the medium 911 and the memory 404, 912, and the disclosure is not limited thereto. The disclosure is not limited to a particular memory device 404 or storage device 406.

Computer system 400 may be implemented using specially programmed, special purpose hardware, or may be a general-purpose computer system that is programmable using a high-level computer programming language. For example, computer system 400 may include cellular phones and personal digital assistants. Computer system 400 usually executes an operating system which may be, for example, the Windows 95, Windows 98, Windows NT, Windows 2000, Windows ME, Windows XP, Windows Vista or other operating systems available from the Microsoft Corporation, MAC OS System X available from Apple Computer, the Solaris Operating System available from Sun Microsystems, or UNIX operating systems available from various sources (e.g., Linux). Many other operating systems may be used, and the disclosure is not limited to any particular implementation. For example, an embodiment of the present disclosure may instruct data center resource providers to restrict access to network devices using a general-purpose computer system with a Sun UltraSPARC processor running the Solaris operating system.

Figure 7:
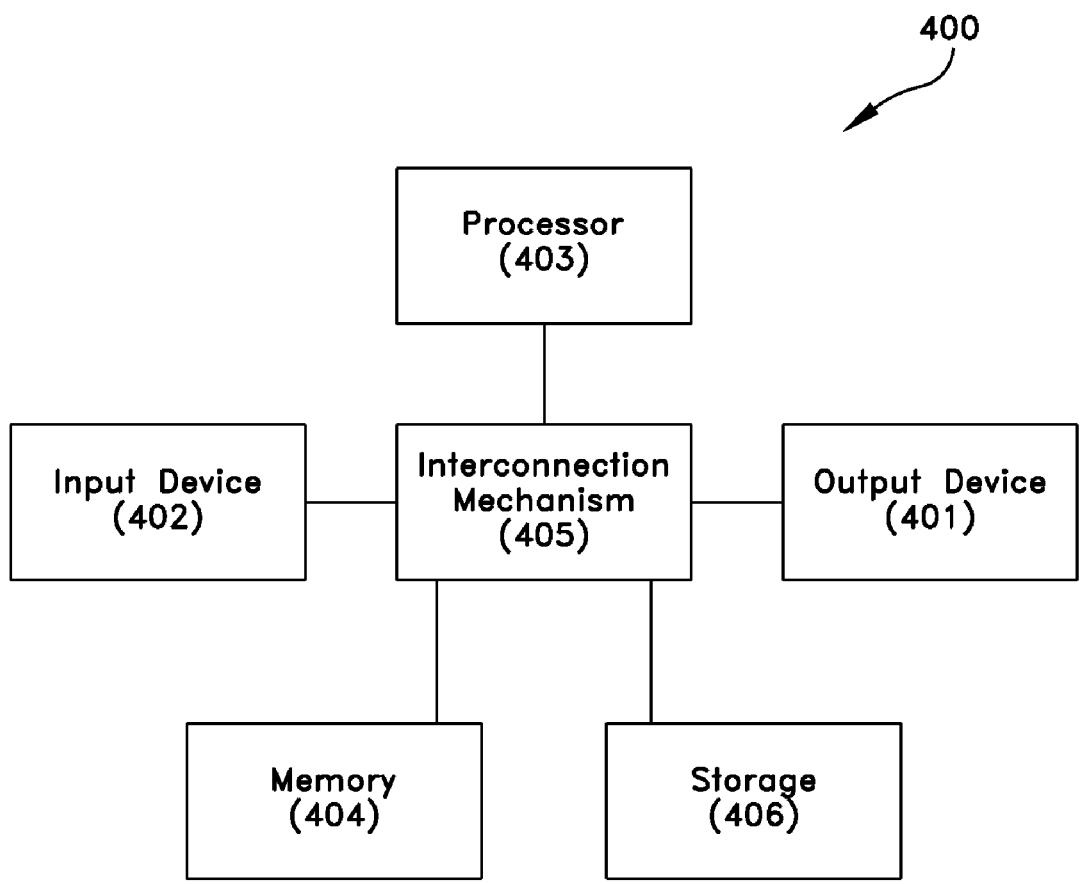
FIG. 7 shows a general-purpose computer system upon which various embodiments of the disclosure may be practiced.

Although computer system 400 is shown by way of example as one type of computer system upon which various aspects of the disclosure may be practiced, it should be appreciated that the disclosure is not limited to being implemented on the computer system as shown in FIG. 7. As discussed, various aspects of the disclosure may be practiced on one or more computers having a different architecture or components than that shown in FIG. 7. To illustrate, one embodiment of the present disclosure may receive network device provisioning requests using several general-purpose computer systems running MAC OS System X with Motorola PowerPC processors and several specialized computer systems running proprietary hardware and operating systems.

Figure 9:
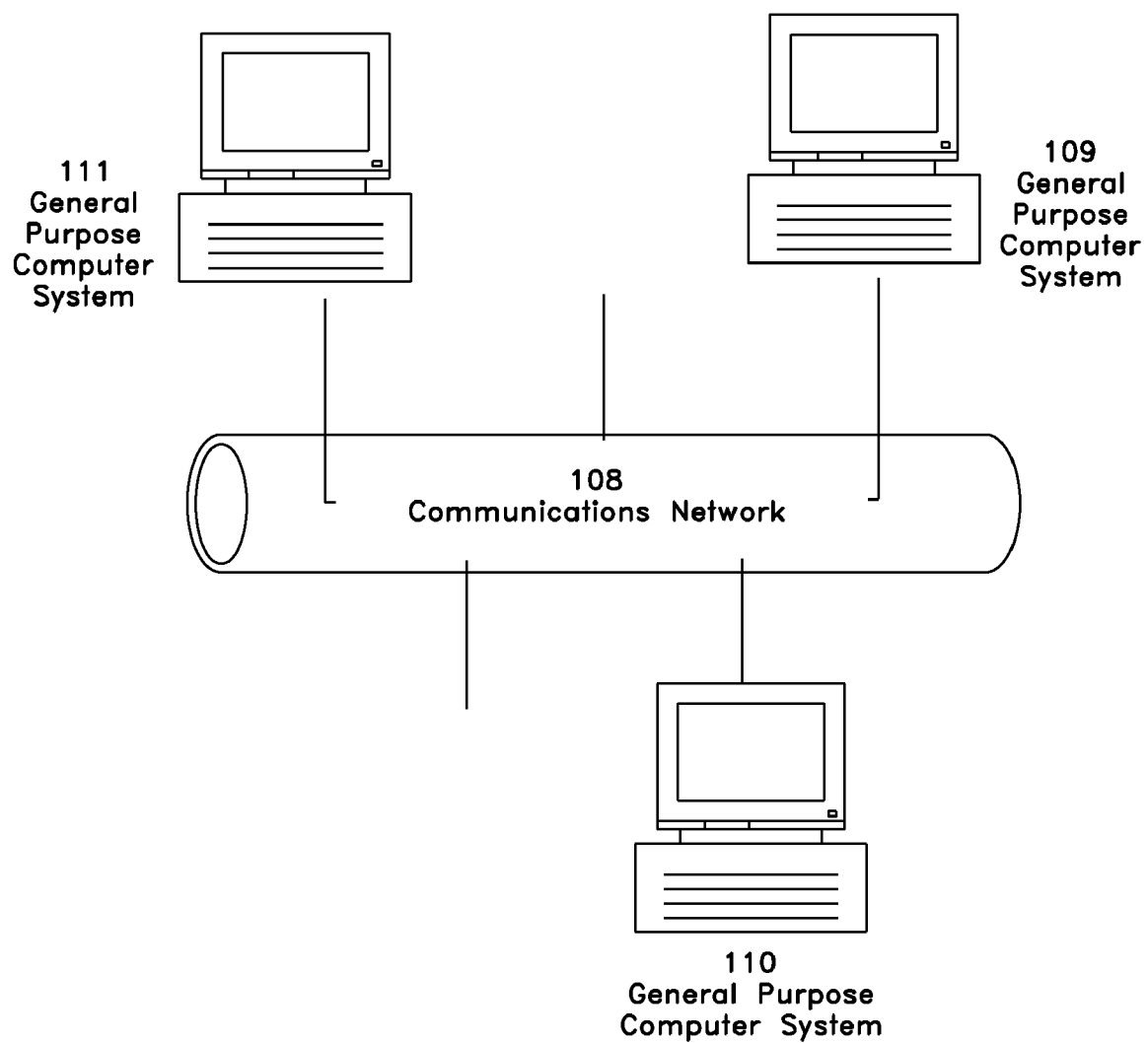
FIG. 9 depicts a network of general-purpose computer systems.

As depicted in FIG. 9, one or more portions of the system may be distributed to one or more computers (e.g., systems 109-111) coupled to communications network 108. The physical media used in communications network 108 may include any known in the art, such as, for example, physical cabling and/or wireless technology (e.g. RF, Infrared, etc.). Moreover, each physical medium may comply with various standards such as, for example, CAT 5 cabling standard or IEEE 802.11, Bluetooth and Zigbee wireless standards. The computer systems 109-111 may also be general-purpose computer systems. For example, various aspects of the disclosure may be distributed among one or more computer systems configured to provide a service (e.g., servers) to one or more client computers, or to perform an overall task as part of a distributed system. More particularly, various aspects of the disclosure may be performed on a client-server system that includes components distributed among one or more server systems that perform various functions according to various embodiments of the disclosure. These components may be executable, intermediate (e.g., IL) or interpreted (e.g., Java) code which communicate over a communication network (e.g., the Internet) using a communication protocol (e.g., TCP/IP). To illustrate, one embodiment may display network device provisioning request status information though a browser interpreting HTML forms and may retrieve data center resource provider information using a data translation service running on a separate server.

Various embodiments of the present disclosure may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the disclosure may be implemented in a non-programmed environment (e.g., documents created in HTML, XML or other format that, when viewed in a window of a browser program, render aspects of a graphical-user interface (GUI) or perform other functions). Various aspects of the disclosure may be implemented as programmed or non-programmed elements, or any combination thereof. For example, a provisioning policy user interface may be implemented using a Microsoft Word document while the application designed to manage provisioning requests may be written in C++.

It should be appreciated that a general-purpose computer system in accord with the present disclosure may perform functions outside the scope of the disclosure. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of UPPSALA, Sweden and WebSphere middleware from IBM of Armonk, N.Y. If SQL Server is installed on a general-purpose computer system to implement an embodiment of the present disclosure, the same general-purpose computer system may be able to support databases for sundry applications.

Based on the foregoing disclosure, it should be apparent to one of ordinary skill in the art that the disclosure is not limited to a particular computer system platform, processor, operating system, network, or communication protocol. Also, it should be apparent that the present disclosure is not limited to a specific architecture or programming language.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. A method for detecting airflow within an air containment zone, the method comprising:
   providing an airflow detecting system at a boundary of the air containment zone; and
   measuring a parameter of airflow within the air containment zone with the airflow detecting system,
   wherein the airflow detecting system comprises
   a structure having an inner surface defining an interior of the tubular structure, one open end and an opposite open end, the tubular structure being configured to receive and expel air through both the one end and the opposite end,
   a membrane connected to the inner surface of the tubular structure to block the interior of the tubular structure,
   a flap formed in the membrane, the flap being connected to the membrane by a hinge, the flap being configured to impede airflow within the interior of the tubular structure upon the application of differential pressure across the two ends of the tubular structure, and
   a device attached to the flap in a position in which the device spans the hinge, the device being configured to measure a parameter associated with the movement of the flap in response to airflow within the interior of the tubular structure.

2. The method of claim 1, wherein the parameter is strain applied to a flap of the airflow detecting system.

3. The method of claim 1, wherein the parameter is a direction of airflow.

4. The method of claim 1, wherein providing an airflow detecting system comprises inserting the airflow detecting system in a panel of the air containment zone.

5. The method of claim 1 further comprising controlling a flow of air out of the air containment zone based on the measured parameter.

6. An airflow detecting system comprising:
   a tubular structure having an inner surface defining an interior of the tubular structure, one open end and an opposite open end, the tubular structure being configured to receive and expel air through both the one end and the opposite end;
   a membrane connected to the inner surface of the tubular structure to block the interior of the tubular structure;
   a flap formed in the membrane, the flap being connected to the membrane by a hinge, the flap being configured to impede airflow within the interior of the tubular structure upon the application of differential pressure across the two ends of the tubular structure; and
   a device attached to the flap in a position in which the device spans the hinge, the device being configured to measure a parameter associated with the movement of the flap in response to airflow within the interior of the tubular structure.

7. An air containment system comprising:
   a panel defining a boundary of an air containment zone;
   an airflow detecting system coupled to the panel, the airflow detecting system being configured to measure direction and magnitude of airflow entering into and out of the boundary of the air containment zone, wherein the airflow detecting system comprises
   a tubular structure having an inner surface defining an interior of the tubular structure, one open end and an opposite open end, the tubular structure being configured to receive and expel air through both the one end and the opposite end,
   a flap connected to the inner surface of the tubular structure by a hinge, the flap being configured to impede airflow within the interior of the tubular structure upon the application of differential pressure across the two ends of the tubular structure, and
   a device attached to the flap in a position in which the device spans the hinge, the device being configured to measure a parameter associated with the movement of the flap in response to airflow within the interior of the tubular structure; and means for controlling airflow into and out of the air containment zone based on a measurement of direction and magnitude of airflow detected by the airflow detecting system.

8. The air containment system of claim 7, wherein the flap is integrally formed with a membrane that is secured to the inner surface of the tubular structure.

9. The air containment system of claim 7, wherein the device is a strain gauge that measures the strain effected on the hinge when the flap moves.

10. The air containment system of claim 9, wherein the airflow detecting system further comprises at least one stop disposed on the inner surface of the tubular structure to engage the flap.

11. The air containment system of claim 7, wherein the means for controlling airflow comprises at least one cooling unit configured to cool air within the air containment zone, the at least one cooling unit including a fan, and a controller coupled to the airflow detecting system and the at least one cooling unit, the controller being configured to manipulate the fan of the at least one cooling unit in response to the measurement of direction and magnitude of airflow detected by the airflow detecting system.

* * * * *